United States Patent [19]

Fukuma

[11] Patent Number: 5,270,249
[45] Date of Patent: Dec. 14, 1993

[54] FABRICATION PROCESS OF A SEMICONDUCTOR DEVICE HAVING A REDUCED PARASITIC CAPACITANCE

[75] Inventor: Hiroyuki Fukuma, Kawasaki, Japan
[73] Assignee: Fujitsu Limited, Kawasaki, Japan
[21] Appl. No.: 846,910
[22] Filed: Mar. 6, 1992
[30] Foreign Application Priority Data Mar. 6, 1991 [JP] Japan ................................. 3-39742

[51] Int. Cl.⁵ .................................... H01L 21/225
[52] U.S. Cl. .................................... 437/162; 437/46; 148/DIG. 9
[58] Field of Search ............. 437/46, 54, 59, 162, 437/984; 148/DIG. 9, DIG. 10, DIG. 11, DIG. 123, DIG. 124

[56] References Cited

U.S. PATENT DOCUMENTS

| 4,808,548 | 2/1989 | Thomas et al. | 148/DIG. 9 |
| 4,868,137 | 9/1989 | Kubota | 437/984 |
| 4,963,502 | 10/1990 | Teng et al. | 437/162 |
| 5,030,584 | 7/1991 | Nakata | 437/162 |
| 5,100,813 | 3/1992 | Nihira et al. | 437/162 |

FOREIGN PATENT DOCUMENTS 2-199868 8/1990 Japan .
2-201931 8/1990 Japan .

Primary Examiner—Brian E. Hearn
Assistant Examiner—C. Chaudhari
Attorney, Agent, or Firm—Staas & Halsey

[57] ABSTRACT

A fabrication process of a semiconductor device comprises the steps of providing a temporary layer on a semiconductor substrate, patterning the temporary layer to form a temporary protection pattern on the semiconductor substrate such that the temporary protection pattern has a pair of opposing side walls extending generally vertically, relatively to the semiconductor substrate, forming a first conductor layer, having incorporated therein an impurity element of a first conductivity type, so as to bury the temporary protection pattern therebeneath, patterning the first conductor layer to form a pair of first type conductor regions contiguous the respective, opposing side walls of the temporary protection pattern, removing the temporary protection pattern selectively with respect to the first type conductor regions thereby to leave the pair of first type conductor regions on the substrate, forming a second conductor layer such that the second conductor layer buries the first type conductor regions therebeneath, patterning the second conductor layer such that only a region thereof remains between the pair of first type conductor regions, as a second type conductor region, and forming first diffusion regions in the substrate respectively in correspondence to the first type conductor regions by diffusion thereinto of the first conductivity type impurity element from the pair of first type conductor regions.

11 Claims, 7 Drawing Sheets

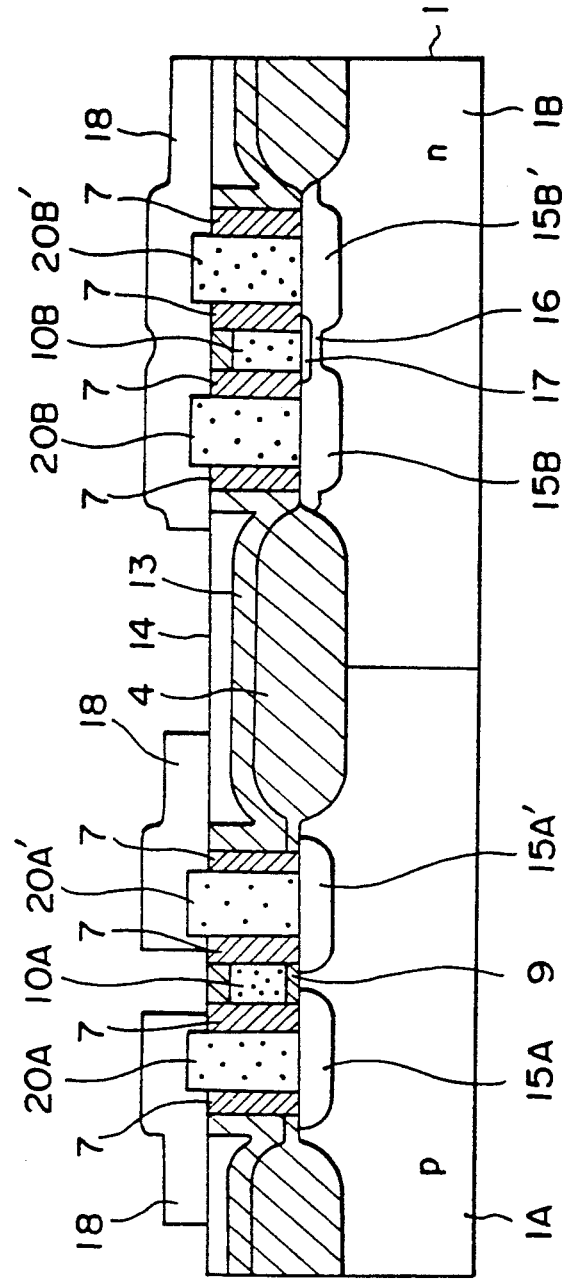

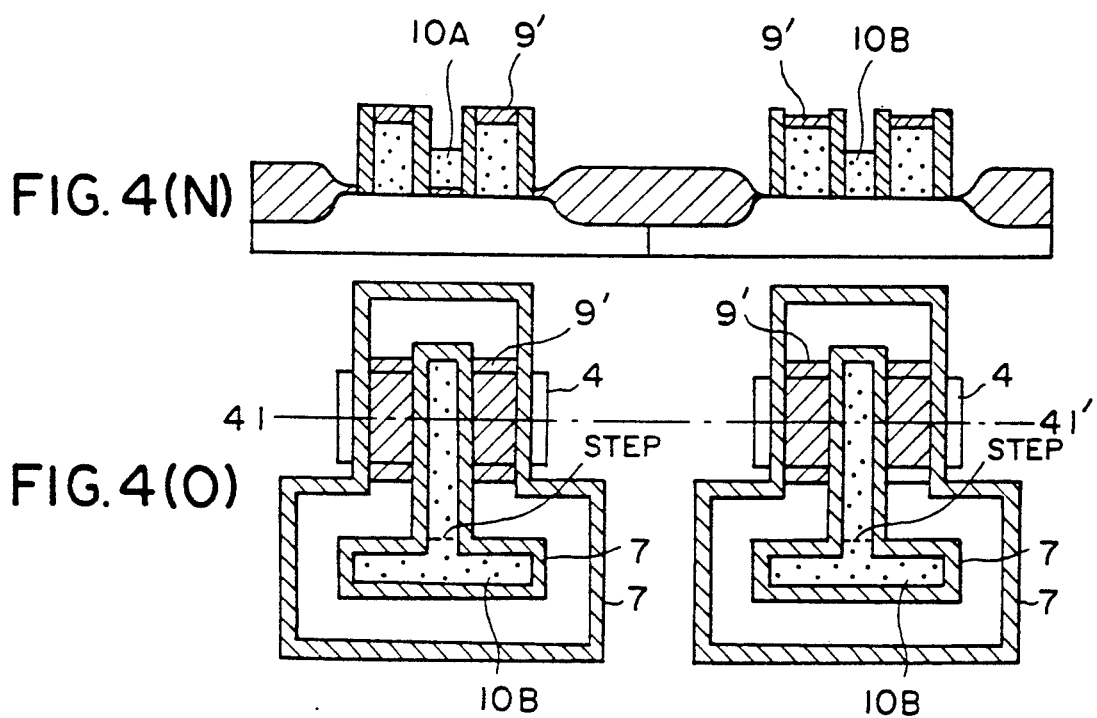

FABRICATION PROCESS OF A SEMICONDUCTOR DEVICE HAVING A REDUCED PARASITIC CAPACITANCE

BACKGROUND OF THE INVENTION

The present invention generally relates to semiconductor devices and more particularly to a semiconductor device, as well as a fabrication process thereof, that has a reduced area of diffusion regions and hence a reduced parasitic capacitance.

In the semiconductor devices, the parasitic capacitance associated with the diffusion region of the device limits the operational speed of the device. In the MOS transistors, for example, the parasitic capacitance of the diffusion regions, forming the source or drain of the device, limits the operational speed of the device. In the bipolar transistors, too, the parasitic capacitance associated with the diffusion regions limits the operational speed.

In the conventional approach, the area of the diffusion region is reduced as much as possible by employing a strict patterning rule. Such a conventional approach has a problem, however, in that the area of the diffusion region cannot be reduced below a certain limit because of the tolerance needed for the patterning of the contact holes or other patterns.

FIG. 1 shows the structure of a conventional BiMOS hybrid integrated circuit wherein a MOS transistor and a bipolar transistor are provided on a common substrate 31.

Referring to FIG. 1, the substrate 31 includes a first region 31A of the p-type silicon acting as a substrate of the MOS transistor and a second region 31B of the n-type silicon acting as a substrate of the bipolar transistor. On the surface of the substrate 31, a field oxide region 32 is formed as usual for defining the respective device regions of the MOS and bipolar transistors. Further, a source region 33 and a drain region 34 of the n+-type are formed in the region 31A of the substrate as usual. On the upper major surface of the region 31A, a gate oxide film 35 of silicon oxide is provided in correspondence to the part between the source region 33 and the drain region 34, and a gate electrode 36 of doped polysilicon is provided on the gate oxide film 35.

On the other hand, a diffusion region 37 of the p-type is formed in the region 31B of the substrate 31 and has formed therein a base 39 of the bipolar transistor. There, the region 31B acts as the collector of the bipolar transistor. Further, a pair of diffusion regions 38 and 38' of the p+-type is formed in the region 31B, connected with the bridging region 37 which is directly underneath the base 39, as base contact regions. On the upper major surface of the region 31B, a polysilicon emitter 310 of the n+-type is formed directly in contact with the base 37.

Further, silicon oxide layers 311 and 312 are provided to protect the gate electrode 36 and the emitter 310 as well as the surface of the substrate 31. In such a structure, the operational speed of the device increases when the parasitic capacitance associated with the diffusion regions forming the source, drain, or base is reduced, and the parasitic capacitance can be reduced by reducing the size of the diffusion regions.

In the structure of FIG. 1, there exist at least the following factors that prevent the satisfactory reduction of the area of the diffusion regions. First, the size "a" of the contact hole formed in the oxide protection film 312 for electric contact between the diffusion region and an interconnection electrode, has to be set larger than a predetermined limit that is determined by the resolution of the exposure process. Second, there must be a tolerance designated in FIG. 1 by "b" and "c" at both sides of the contact hole such that the contact hole does not expose the field oxide region 32 or the electrode 36 even when there is a deviation in the alignment of the exposure patterns. A similar problem occurs also in the bipolar transistor.

FIG. 2 shows another conventional hybrid integrated circuit that includes both a MOS transistor and a bipolar transistor on a common substrate 41 of silicon.

Referring to FIG. 2, the substrate 41 includes a first region 41A of the p-type silicon acting as a substrate of the MOS transistor and a second region 41B of the n-type silicon acting as a substrate as well as the collector of the bipolar transistor. On the surface of the substrate 41, a field oxide region 42 is formed as usual for defining the respective device regions of the MOS and bipolar transistors. Further, a source region 43 and a drain region 44 of the n+-type are formed in the region 41A of the substrate as usual.

On the region 41A, a polysilicon electrode layer is provided, extending along the upper major surface thereof and patterned to form a first polysilicon pattern 46 and a second polysilicon pattern 47 respectively in contact with the source region 43 and the drain region 44. Thereby, the surface of the silicon substrate 41 is exposed in correspondence to a part located between the first polysilicon pattern 46 and the second polysilicon pattern 47. Further, the polysilicon patterns 46 and 47 are covered by a thin silicon oxide film 48, and contact holes are formed on the silicon oxide film 48 in correspondence to the field oxide region 42. Furthermore, the exposed part of the substrate 41 located between the polysilicon patterns 46 and 47 is covered by the silicon oxide film 45 that act as a gate oxide film, and a gate electrode 49 of doped polysilicon is provided on the gate oxide film 45.

In the bipolar transistor, on the other hand, a diffusion region 410 of the p-type is formed in the region 41B of the substrate 41 and has formed therein a base 412 of the bipolar transistor. Further, a pair of diffusion regions 411 and 411' of the p+-type is formed in the region 41B, connected with the bridging region 410 which is directly underneath the base 412, as base contact regions. On the region 41B, a doped polysilicon layer is provided to cover the upper major surface of the substrate 41 and patterned to form polysilicon patterns 413A and 413B that are separated from each other at a part of the substrate where the diffusion region 410 is formed. In other words, the surface of the base 412 is exposed at the part where the polysilicon patterns 413A and 413B are separated from each other.

On the polysilicon patterns 413A and 413B, a silicon oxide film 414 is provided as an insulation film that covers the surface of the device except for the base 412, and an emitter electrode 415 of the n+-type polysilicon is formed on the silicon oxide film 414 such that the emitter electrode 415 achieves a direct contact with the base 410. Further, contact holes are provided on the silicon oxide film 414 for external connection between an interconnection conductor pattern and the polysilicon patterns 413A, 413B.

In the structure of FIG. 2, one can eliminate the formation of the contact holes for exposing the diffusion regions and the problems associated with the formation of the contact holes, such as the resolution of the contact holes or deviation in the exposure pattern of the contact holes, are eliminated altogether. Thereby, one can reduce the size "d" of the diffusion region as desired. On the other hand, the structure of FIG. 2 has a problem in that the resistance of the electric connection increases inevitably due to the existence of the polysilicon patterns that extend laterally for a relatively long distance between the diffusion region and the low resistance interconnection electrodes. Such a resistance contributes to the time constant of the electric connection system and hence to the undesirable reduction of the operational speed of the device.

SUMMARY OF THE INVENTION

Accordingly, it is a general object of the present invention to provide a novel and useful semiconductor device and a process for fabricating the same, wherein the foregoing problems are eliminated.

Another and more specific object of the present invention is to provide a semiconductor device and a fabrication process thereof, wherein the parasitic capacitance associated with diffusion regions in the device is minimized.

Another object of the present invention is to provide a semiconductor device and a fabrication process thereof, wherein the device includes a diffusion region connected electrically to an interconnection conductor pattern, and wherein the area of the diffusion regions is minimized.

Another object of the present invention is to provide a fabrication process of a semiconductor device, comprising the steps of: providing a temporary layer on a surface of a semiconductor layer on which the semiconductor device is to be formed; patterning the temporary layer to form a temporary protection pattern on the surface of the semiconductor layer such that the temporary protection pattern has a pair of opposing side walls extending generally vertically to the surface of the semiconductor layer and such that the surface of the semiconductor layer is exposed at said both side walls of the temporary protection pattern; forming a first conductor layer that incorporates therein an impurity element of a first conductivity type such that the conductor layer buries the temporary protection pattern underneath with an intimate contact with said both side walls of the temporary protection pattern and such that the conductor layer establishes a contact with the exposed surface of the semiconductor layer exposed at said both lateral side walls of the temporary protection pattern; patterning the first conductor layer to form a pair of first type conductor regions existing on said both side walls of the temporary protection pattern with an intimate contact therewith; removing the temporary protection pattern selectively with respect to the first type conductor regions, thereby to leave the first type conductor regions on the semiconductor layer such that each of the first type conductor regions has an exposed side wall that extends generally vertically to the surface of the semiconductor layer; forming a second conductor layer such that the second conductor layer buries the first type conductor regions underneath; patterning the second conductor layer such that the second conductor layer is left only between said pair of the first type conductor regions as a second type conductor region; and forming first diffusion regions in the substrate respectively in correspondence to the first type conductor regions by diffusion of the impurity element. According to the present invention, the diffusion regions are formed in the substrate after the first and second conductor regions are formed in a self-alignment process with the conductor regions. Thereby, the problems such as the tolerance at the time of patterning the contact holes or the resolution at the time of exposing the contact holes, are explicitly eliminated. Further, the first and second conductor regions extend vertically from the diffusion regions with a minimum length and the problem of increased resistance associated with the use of polysilicon conductor regions is minimized.

Other objects and further features of the present invention will become apparent from the following detailed description when read in conjunction with the attached drawings.

BRIEF DESCRIPTION OF THE DRAWINGS

FIG. 3 is a diagram showing the structure of a semiconductor device according to an embodiment of the present invention.

DETAILED DESCRIPTION OF PREFERRED EMBODIMENTS

Figure 1:
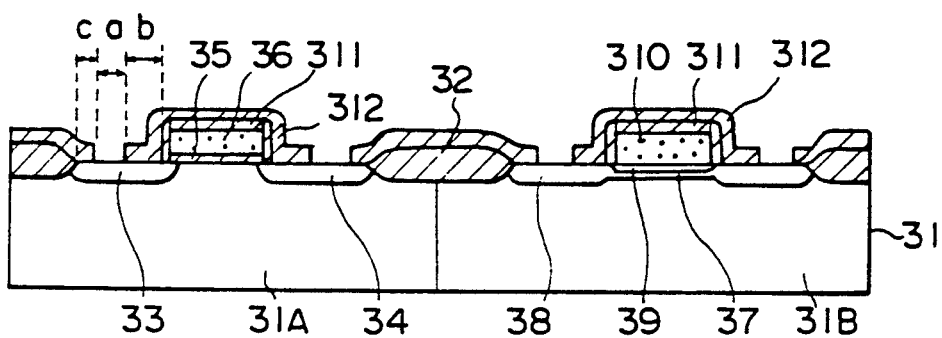
FIG. 1 is a diagram showing the structure of a conventional semiconductor device.
Figure 2:
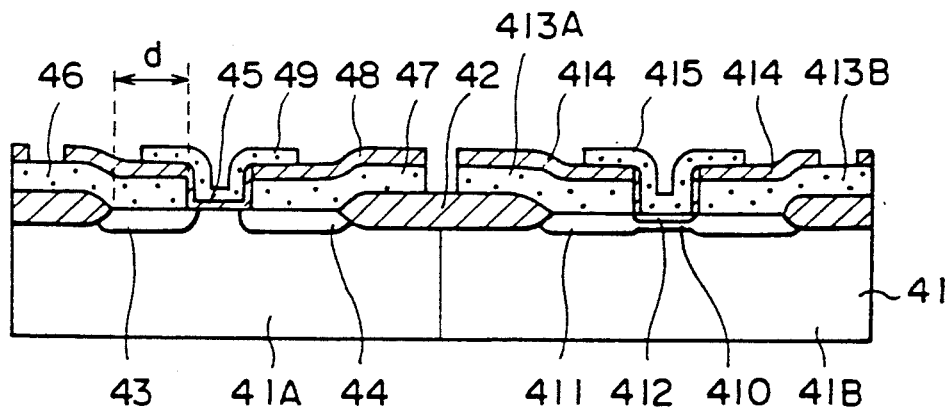
FIG. 2 is a diagram showing the structure of another conventional semiconductor device.

FIG. 3 shows the structure of a BiMOS hybrid integrated circuit according to an embodiment of the present invention.

Referring to FIG. 3, the BiMOS integrated circuit is formed on a substrate 1 of silicon. The silicon substrate 1 includes a first region 1A of the p-type in correspondence to where the MOS transistor is to be formed and a second region 1B of the n-type silicon in correspondence to where the bipolar transistor is to be formed. The region 1B acts also as the collector of the bipolar transistor. Further, a field oxide region 4 of silicon oxide is formed on the surface of the substrate as usual, and the field oxide region 4 defines the respective device regions of the MOS transistor and the bipolar transistor. In correspondence to the device region of the MOS transistor, there are formed a pair of diffusion regions 15A and 15A' at the upper major surface of the substrate 1 respectively as the source region and the drain region. As usual, the diffusion regions 15A and 15A' are formed with a separation from each other, and a channel region is formed in correspondence to the separation between the diffusion regions.

In the device region of the MOS transistor, doped polysilicon electrodes 20A and 20A' are formed on the substrate 1 to extend from the upper major surface generally in an upward direction, respectively in correspondence to the diffusion regions 15A and 15A', and a protective layer 7 of silicon nitride is formed on respective side walls of the polysilicon electrodes 20A and 20A'. Further, the surface of the silicon substrate 1 is protected by a silicon oxide film 9 in correspondence to the channel region of the MOS transistor, and a gate electrode 10A of doped polysilicon is provided on the silicon oxide film 9 that acts as a gate oxide film.

In the device region of the bipolar transistor, a p-type diffusion region 16 has formed therein a base 17 of the bipolar transistor. Further, a pair of $p^+$-type diffusion regions 15B and 15B' are formed such that the diffusion regions 15B and 15B' are connected with each other by the thin bridging region 16 of the p-type which is formed immediately below the base 17. In the bipolar transistor, too, doped polysilicon electrodes 20B and 20B' are formed on the substrate in correspondence to the diffusion regions 15B and 15B', extending in an upward direction, and the silicon nitride protective layer 7 is formed on the respective side walls of the electrodes 20B and 20B'.

Further, the surface of the structure thus formed is covered by a silicon oxide layer 13 and a planarization process is applied by forming an SOG layer 14 on the layer 13 such that the layer 14 fills the depressed part of the layer 13. After the SOG layer 14 is formed as such, the top part of the vertical polysilicon electrodes 20A, 20A', 20B and 20B' are exposed by an RIE process, and an interconnection pattern 18 of aluminum is provided in contact with the exposed top end of the polysilicon electrodes.

As will be described in detail hereinafter, the vertical polysilicon electrodes 20A, 20A', 20B and 20B' are formed before the diffusion regions 15A, 15A', 15B and 15B' are formed. More specifically, the diffusion regions are formed only after the polysilicon electrodes are formed as a result of diffusion of the impurity element from the polysilicon electrodes into the substrate. Thereby, the diffusion regions are formed in self-alignment with to the polysilicon electrodes, however small the polysilicon electrodes may be formed. Thereby, one can reduce the area of the diffusion regions and hence the parasitic capacitance associated with the diffusion regions.

Hereinafter, the fabrication process of the device of FIG. 3 will be described in detail with reference to FIGS. 4(A)–4(S).

Figures 4A, 4B, 4C, 4D:
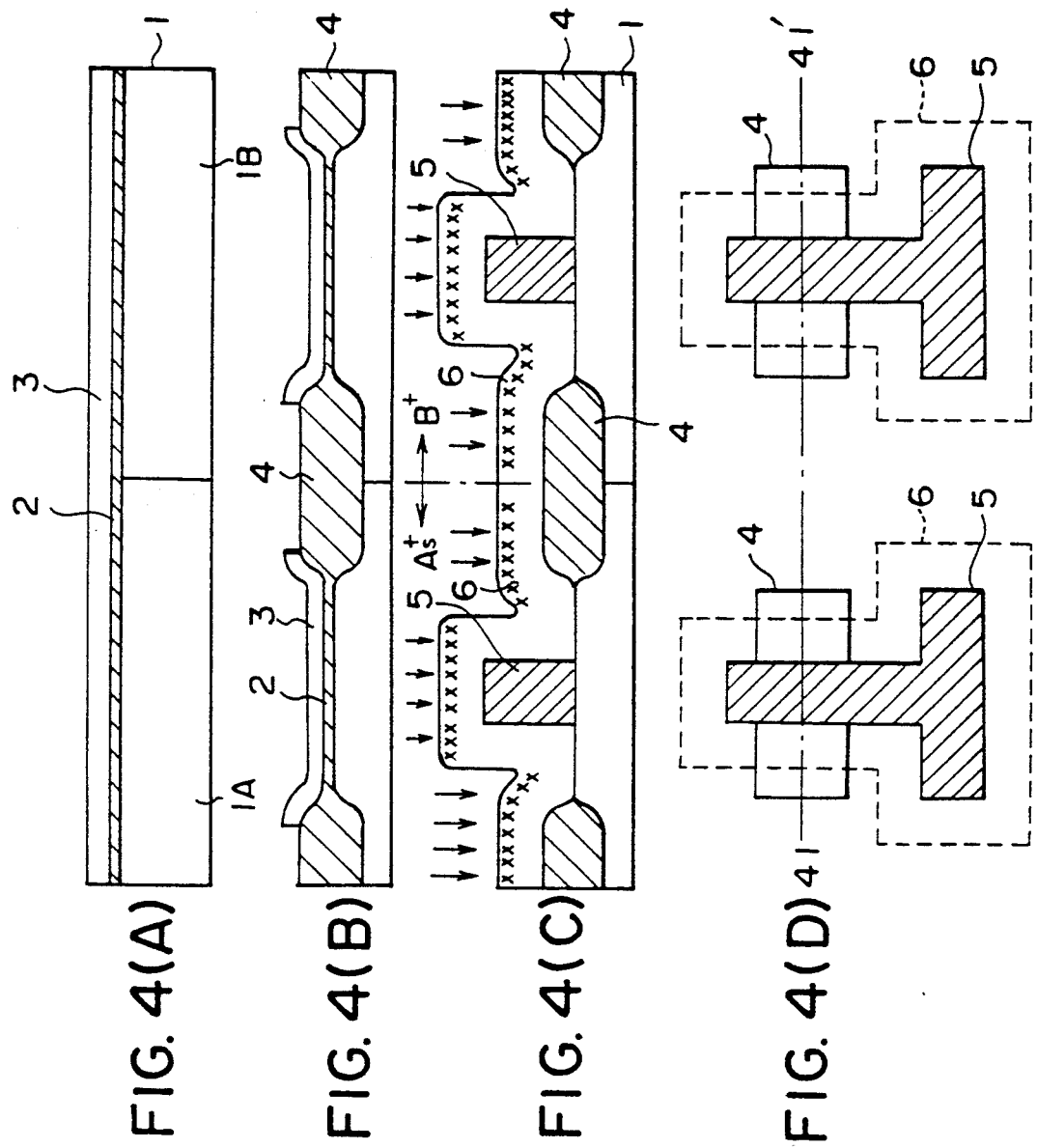
FIGS. 4(A)–4(S) are diagrams showing the fabrication process of the device of FIG. 3.

In the step of FIG. 4(A), a silicon oxide film 2 is formed on the surface of the silicon substrate 1 with a thickness of 50–200 Å by thermal oxidation of the silicon substrate. As already noted, the substrate 1 is formed with the p-type region 1A and the n-type region 1B. Further, a silicon nitride film 3 is provided on the silicon oxide film 2 with a thickness or 1000–2000 Å.

In the step of FIG. 4(B), the silicon nitride film 3 is patterned and an oxidation process is achieved under the presence of water vapor such that the field oxide region 4 is formed in correspondence to the part where the surface of the silicon oxide film 2 is exposed.

In the step of FIG. 4(C), a silicon nitride layer is deposited on the surface of the structure of FIG. 4(B) by a CVD process with a thickness of about 2000–4000 Å and patterned subsequently such that a silicon nitride pattern 5 is left in correspondence to each device region. Further, a polysilicon layer 6 is deposited on the structure thus formed such that the patterned silicon nitride pattern 5 is buried under the polysilicon layer 6. Thereby, the polysilicon layer 6 makes an intimate contact with the exposed surface of the substrate 1.

After the polysilicon layer 6 is thus formed, an ion implantation of an n-type dopant such as As+ is conducted on the polysilicon layer 6 in correspondence to a part of the layer 6 covering the device region of the MOS transistor as shown in FIG. 4(C). Further, another ion implantation process is conducted for incorporating a p-type dopant such as B+ into the polysilicon layer 6 in correspondence to a part that covers the device region of the bipolar transistor. See also FIG. 4(C). In the foregoing ion implantation process, the As+ ions are implanted under the acceleration voltage of 40–70 keV with a dose of $5 \times 10^{14}$ cm$^{-2}$. On the other hand, the B+ ions are implanted under the acceleration voltage of 30 - 40 keV with the dose of $5 \times 10^{14}$ cm$^{-2}$. Of course, different masks are used for the ion implantation of As+ and B+.

FIG. 4(D) shows a plan view of the semiconductor structure of FIG. 4(C). It should be noted that the cross sectional view of FIG. 4(C) is taken along a line 41—41' of FIG. 4(D). As can be seen in the plan view of FIG. 4(D), the silicon nitride pattern 5 forms an inverted T-shape both in the device region of the MOS transistor and the device region of the bipolar transistor, wherein the leg of the inverted T-shape pattern crosses the rectangular device region that is surrounded by the field oxide layer 4. Further, in the plan view of FIG. 4(D), the polysilicon layer 6 is projected in the upward direction generally in conformity with the inverted T-shape as represented by a broken line.

Figure 4E:
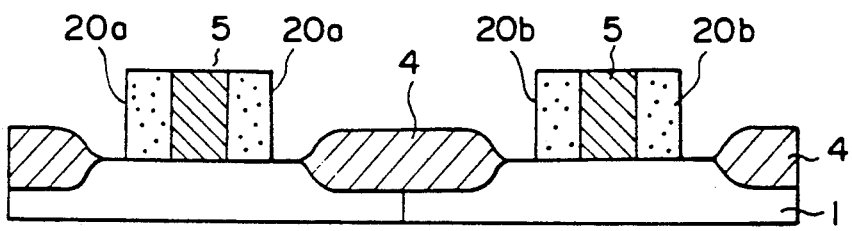

After the polysilicon layer 6 is thus formed, an RIE process is applied to the polysilicon layer 6 in the vertical direction to the upper major surface of the substrate 1 until the surface of the substrate as well as the surface of the field oxide region 4 are exposed. Thereby, the polysilicon layer is removed except for a part adjacent to the side wall of the silicon nitride pattern 5 as shown in FIG. 4(E). In FIG. 4(E), it will be seen that a polysilicon pattern 20a is formed at the side wall of the pattern in correspondence to the device region of the MOS transistor, while a polysilicon pattern 20b is formed at the side wall of the pattern in correspondence to the device region of the bipolar transistor.

Figure 4F:
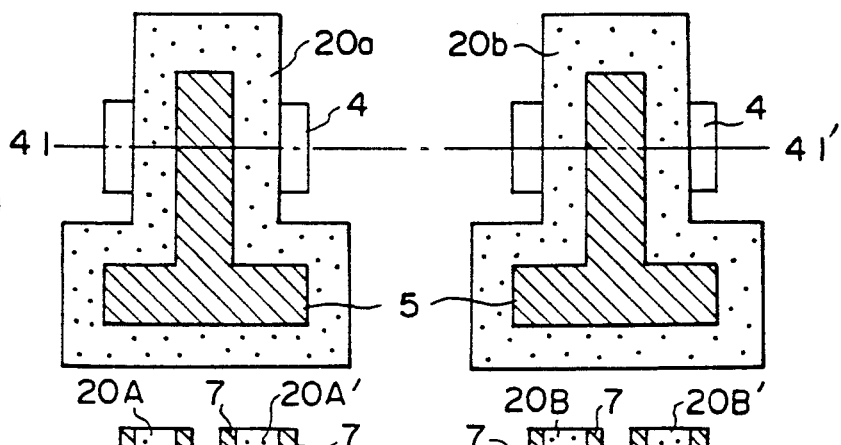

FIG. 4(F) shows the plan view of the structure thus obtained. It will be noted that the polysilicon pattern 20a extends along the side wall of the silicon nitride pattern 5 in correspondence to the device region of the MOS transistor while the polysilicon pattern 20b extends along the side wall of the silicon nitride pattern 5 in correspondence to the device region of the bipolar transistor.

Figure 4G:
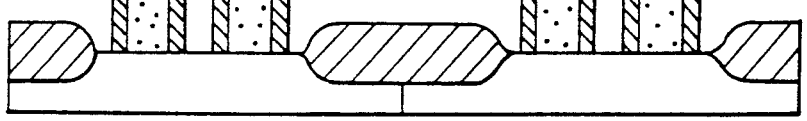

Next, in the step of FIG. 4(G), the silicon nitride pattern 5 is selectively removed with respect to the polysilicon patterns 20a and 20b by an etching process conducted in a hot phosphoric acid. There, the T-shaped pattern 5 of FIG. 4(F) is removed and the polysilicon patterns 20a and 20b alone are left on the surface of the substrate 1. Further, a silicon nitride film is deposited on the structure thus obtained by a CVD process and patterned subsequently by an RIE process that acts vertically to the surface of the substrate until the surface of the substrate 1 is exposed. Thereby, the silicon nitride film that is deposited on the side wall of the polysilicon patterns 20a and 20b remains substantially intact as shown in FIG. 4(G) and forms the silicon nitride protective layer 7 described already with reference to FIG. 3.

Figure 4H:
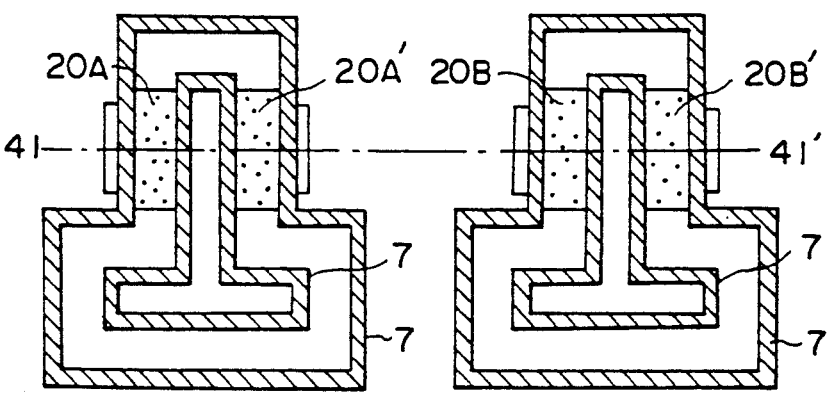

Next, in the step of FIG. 4(H), the polysilicon patterns 20a and 20b are patterned further as shown in the plan view to form the polysilicon electrodes 20A, 20A', 20B and 20b', which have been described already with reference to FIG. 3.

Figure 4I:
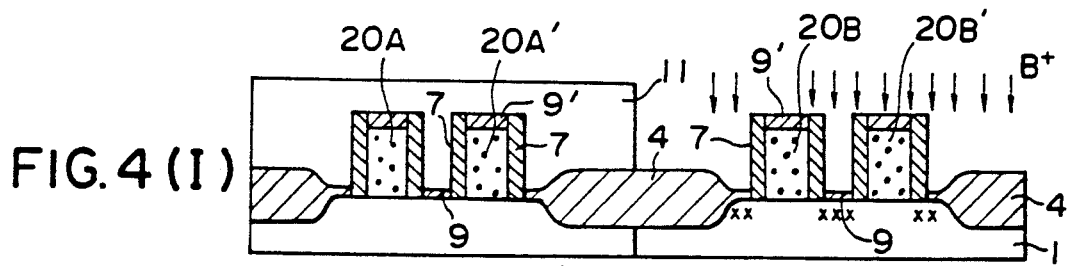

In the step of FIG. 4(I), the structure of FIG. 4(G) is subjected to a thermal oxidation process, and a silicon oxide film 9 is formed on the exposed part of the silicon substrate 1 in a thickness of 50–150 Å. This silicon oxide film 9 forms the gate oxide film in the device region of the MOS transistor, while the silicon oxide film 9 serves as a through-oxide film for the ion implantation in the device region of the bipolar transistor. Further, a silicon oxide film 9' is formed on the exposed top surface of the polysilicon electrodes 20A, 20A', 20B and 20B' simultaneously as a result of the oxidation. Next, the device region of the MOS transistor is protected by a resist 11 and an ion implantation of B+ is conducted into the device region of the bipolar transistor with the acceleration voltage of 10–35 keV and the dose of $3-7\times10^{13}$ cm$^{-3}$. Thereby, the boron ions are incorporated into the substrate 1 in correspondence to the device region of the bipolar transistor except for the part that is protected by the electrodes 20B and 20B'.

Figure 4J:
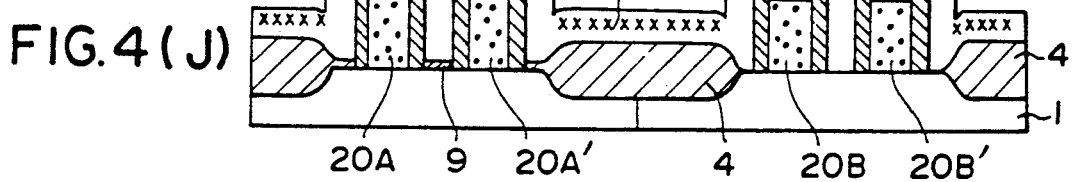

After the boron ions are thus incorporated, the silicon oxide film 9 that covers the surface of the substrate 1 in correspondence to the device region of the bipolar transistor is removed while using the resist 11 as a mask. Thereby, it should be noted that the silicon oxide film 9' that covers the top surface of the polysilicon electrodes 20B and 20B' remains, though with a reduced thickness. It should be noted that the silicon oxide film 9', grown on the polysilicon region, has a thickness larger than the silicon oxide film 9 that is grown on the single crystal silicon substrate 1. See the structure of FIG. 4(J). After the removal of the silicon oxide film 9, the resist 11 itself is removed. Next, another polysilicon layer 12 is grown on the structure thus formed by a CVD process with a thickness of 500–2000 Å as shown in FIG. 4(J) and an ion implantation of As+ is conducted under the acceleration voltage of 40–70 keV with a dose of $1-2\times10^{16}$ cm$^{-2}$.

Figure 4K:
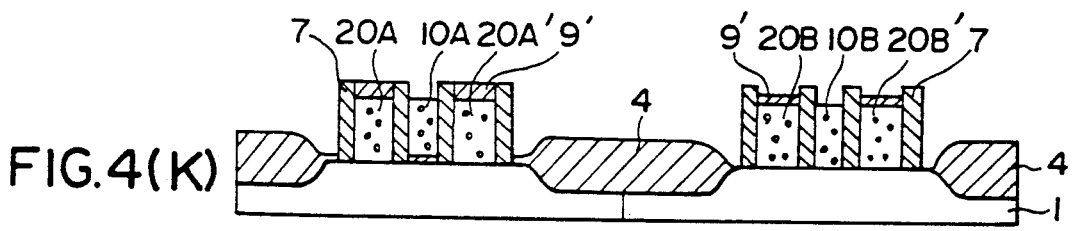

Next, in the step of FIG. 4(K), the polysilicon layer 12 is patterned by an isotropic etching process until the surface of the field oxide region 4 is exposed. Thereby, a polysilicon pattern is left between the polysilicon electrodes 20A and 20A' as the gate electrode 10A of the MOS transistor. Similarly, another polysilicon pattern is left between the polysilicon electrodes 20B and 20B' as the emitter 10B of the bipolar transistor.

Figure 4L:
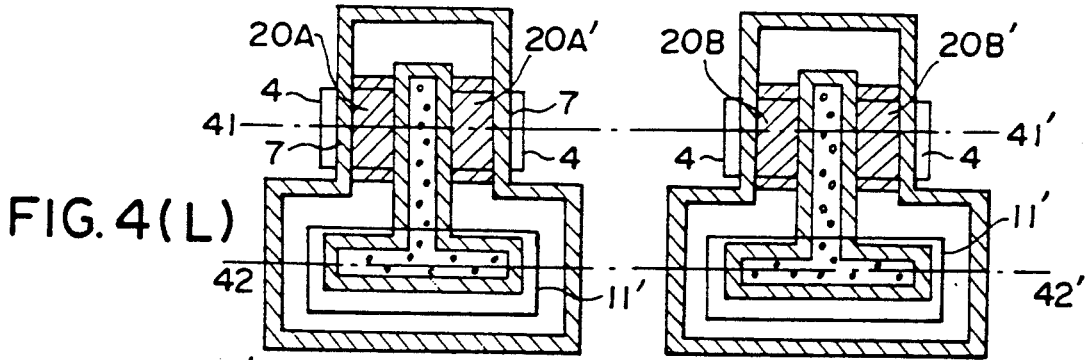
Figure 4M:
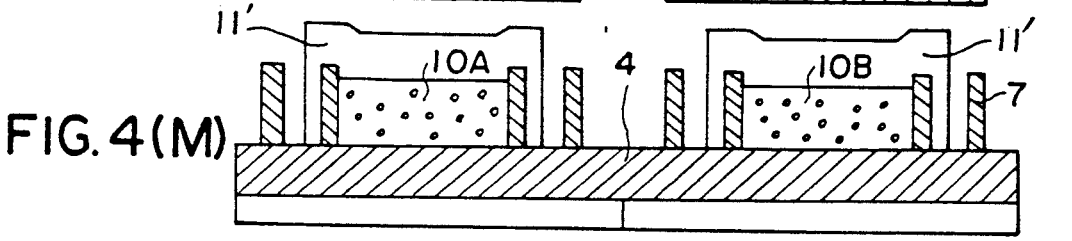

Next, in the step of FIG. 4(L), the base part of the inverted T-shape pattern is protected by another resist 11' as shown in the plan view (FIG. 4(M)), and the thickness of the polysilicon electrodes 10A and 10B is reduced by a controlled etching process. FIG. 4(M) shows the cross section of the structure of FIG. 4(L) along a line 42—42'. It should be noted that the polysilicon electrodes 20A, 20A', 20B and 20B' are protected by the silicon oxide film and therefore are not etched during this process. Thereby, a structure shown in FIGS. 4(N) and 4(O) is obtained, wherein FIG. 4(O) shows the plan view and FIG. 4(N) shows a cross sectional view taken along the line 41—41'. In the plan view of FIG. 4(O), the step formed in the polysilicon electrodes 10A and 10B as a result of the foregoing controlled etching process is shown by a broken line.

Figures 4P, 4Q, 4R, 4S:
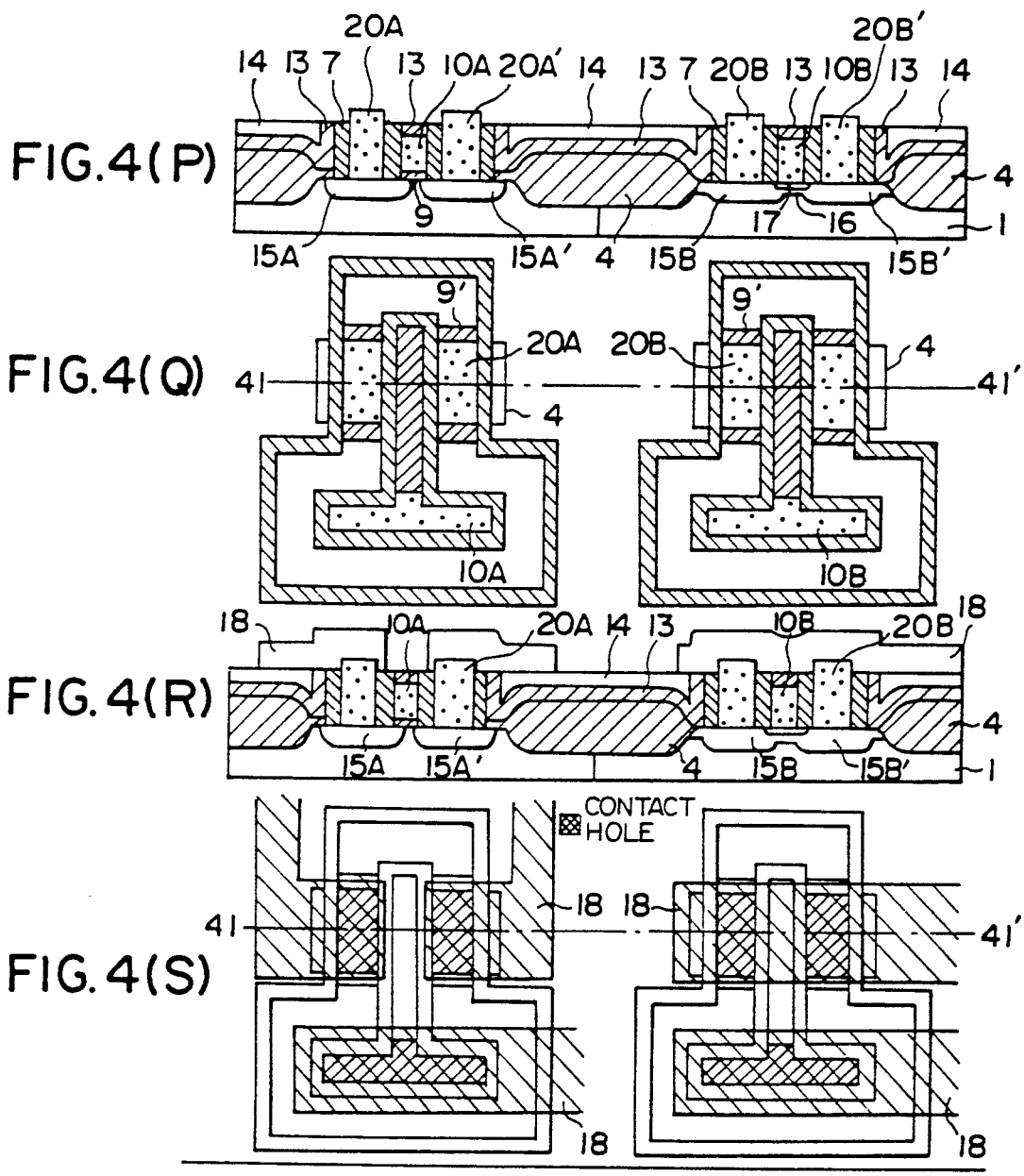

Next, in the step of FIG. 4(P), a silicon oxide layer 13 is deposited on the structure of FIG. 4(N) by a CVD process with a thickness of about 1000 Å, and an SOG layer 14 is formed further thereon with a thickness of 2000–3000 Å by a spin coating process. It should be noted that the silicon oxide layer 13 fills the space formed above the polysilicon electrodes 10A and 10B.

Further, the structure thus obtained is subjected to a thermal annealing process at 1000°–1050° C. for 10–30 seconds to cause the thermal diffusion of the dopants incorporated into the polysilicon electrodes 20A, 20A', 20B and 20B' as well as in the polysilicon emitter 10B. Thereby, the arsenic ions are diffused into the substrate 1 from the polysilicon electrodes 20A and 20A', and the source region 15A and the drain region 15A' are formed in the substrate 1 immediately underneath the polysilicon electrodes 20A and 20A', respectively. Simultaneously, the boron ions doped in the step of FIG. 4(I) are diffused into the silicon substrate 1 in the device region of the bipolar transistor, and the base 16 of the p-type is formed thereby Further, the base contact region 15B and 15B', and the emitter region 17 of the n+-type are formed also as a result of the diffusion of the arsenic ions.

After the diffusion process described above, the surface of the structure is subjected to a controlled etching process such that the SOG layer 14 as well as the exposed part of the silicon nitride layer 7 and the silicon oxide layer 13 are etched slightly. Thereby, the structure shown in FIG. 4(P) is obtained such that the polysilicon electrodes 20A, 20A', 20B and 20B' project above the upper major surface of the structure. FIG. 4(Q) shows the plan view of the structure thus formed.

Further, in the step of FIG. 4(R), a conductor layer 18 of aluminum or copper is deposited on the structure of FIGS. 4(P) and 4(Q) and patterned subsequently to form the interconnection patterns connected to the respective electrodes of the MOS transistor and the bipolar transistor as shown in the plan view of FIG. 4(S).

In the structure of the BiMOS integrated circuit of the present invention, the contact holes designated in FIG. 4(S) by the cross hatching are formed immediately above the polysilicon electrodes 20A, 20A', 20B and 20B', and the length of the polysilicon electrodes is minimized. Associated therewith, the resistance of the interconnection is reduced and the operational speed of the semiconductor device is improved. Further, as will be understood from the diffusion process of FIG. 4(P), the diffusion regions such as the region 15A, 15A' 15B', 16 and 17 are formed in a self-alignment manner with the corresponding electrodes 20A, 20A', 20B, 20B' and 10B, and thereby the area of the diffusion regions can be minimized without being restrained by the tolerance at the time of patterning. In fact, the area of the diffusion regions such as the source 15A and the drain 15A' of the MOS transistor can be reduced as desired by reducing the size of the polysilicon electrodes. Thereby, the parasitic capacitance associated with the diffusion region can be minimized and the operational speed of the device is maximized.

In the process described heretofore, it will be understood that the material for the pattern 5 is not limited to silicon oxide. In fact, the pattern 5 is removed in the step of FIG. 4(G) by the selective etching process. Thus, any material that shows a different etching rate with respect to silicon may be employed for the pattern 5.

Further, it should be noted that the electrodes 20B and 20B' of the bipolar transistor need not necessarily be formed into two separate parts in the step of FIG. 4(H) but may be formed as a single body.

Further, the present invention is not limited to the embodiments described heretofore, but various variations and modifications may be made without departing from the scope of the invention.

What is claimed is:

1. A method for fabricating a semiconductor device, comprising the steps of:
providing a temporary layer on a major surface of a semiconductor substrate;
patterning the temporary layer to form a temporary pattern on the main surface of the semiconductor substrate, in correspondence to a part of said main surface on which the semiconductor device is to be formed, said step of patterning the temporary layer being conducted such that the temporary pattern has a side wall and the surface of the semiconductor substrate is exposed in a portion thereof at and adjacent said side wall;

forming a conductor layer, of a material incorporating therein an impurity element, such that the conductor layer buries the temporary pattern therebeneath and is in intimate contact with said side wall of said temporary pattern and with the exposed surface portion of the semiconductor substrate adjacent the side wall of the temporary pattern;

patterning the conductor layer to form a conductor region in intimate contact with the side wall of the temporary pattern and in intimate contact with the exposed surface portion of the semiconductor substrate, said step of patterning the conductor layer comprising anisotropically etching the conductor layer selectively in a direction perpendicular to the major surface of said semiconductor substrate thereby to remove said conductor layer except for a wall-like region thereof located immediately adjacent to and remaining in intimate contact with said side wall of said temporary pattern;

removing the temporary pattern selectively with respect to the wall-like conductor region; and forming a diffusion region in the semiconductor substrate, in correspondence to a surface portion thereof on which said wall-like conductor region is provided, by causing a diffusion thereinto of said impurity element.

2. A method as claimed in claim 1 in which said step of providing the temporary layer comprises depositing a material that has an etching rate different from that of the conductor layer material.

3. A method as claimed in claim 2 in which said conductor layer material essentially consists of polysilicon and said temporary layer essentially consists of silicon nitride.

4. A method as claimed in claim 1 in which said step of forming the conductor layer comprises depositing a polysilicon layer and doping the polysilicon layer by ion implantation of said impurity element.

5. A method for fabricating a semiconductor device, comprising the steps of:

providing a temporary layer on a surface of a semiconductor substrate on which the semiconductor device is to be formed;

patterning the temporary layer to form a temporary protection pattern on the main surface of the semiconductor substrate such that the temporary protection pattern has a pair of opposing side walls extending generally vertically to the surface of the semiconductor substrate and such that surface portions of the semiconductor substrate are exposed at and adjacent said both opposing side walls of the temporary protection pattern;

forming a first conductor layer, of a material that incorporates therein an impurity element of a first conductivity type, such that the conductor layer buries the temporary protection pattern therebeneath and is in intimate contact with said both opposing side walls of the temporary protection pattern and with the exposed surface portions of the semiconductor substrate at and adjacent both said opposing side walls of the temporary protection pattern;

patterning the first conductor layer to form a pair of first type conductor regions adjacent to and in intimate contact with, respectively, said both opposing side walls of the temporary protection pattern, said step of patterning the first conductor layer comprising anisotropically etching the conductor layer selectively in a direction perpendicular to the major surface of said semiconductor substrate thereby to remove said conductor layer except for said pair of first type conductor regions, respectively located immediately adjacent to and in intimate contact with said opposing side walls of said temporary protection pattern;

removing the temporary protection pattern selectively with respect to said pair of first type conductor regions and such that said pair of first type conductor regions remains on, and in intimate contact with, the semiconductor layer such that each of said pair of first type conductor regions has an exposed side wall that extends generally vertically to the surface of the semiconductor substrate;

forming a second conductor layer such that the second conductor layer buries said pair of first type conductor regions therebeneath;

patterning the second conductor layer such that a potion of the second conductor layer remains, between said pair of first type conductor regions, as a second type conductor region; and forming first diffusion regions in the semiconductor substrate, respectively in correspondence to major surface portions thereof on which said pair of first type conductor regions are provided, by causing diffusion thereinto of said impurity element.

6. A method as claimed in claim 5 further comprising, after the step of selectively removing the temporary protection pattern and before the step of forming the second conductor layer, forming an insulation film on said respective, exposed side walls of said pair of first type conductor regions.

7. A method as claimed in claim 5 in which said step of patterning the first conductor layer to form said pair of first type of conductor regions comprises forming said pair of first type conductor regions as mutually isolated, patterned regions on corresponding portions of the major surface of the substrate.

8. A method as claimed in claim 5 in which said step of forming the second conductor layer further comprises doping the second conductor layer by an impurity element to a second, opposite conductivity type and forming a second diffusion region in the semiconductor substrate in the portion thereof underneath the second type conductor region by causing a diffusion thereto of the second impurity element from the second type conductor region.

9. A method as claimed in claim 5 further comprising, after the step of removing the temporary protection pattern and before the step of forming the second conductor layer, forming an insulation film on the major surface of the substrate in correspondence to the portion of the major surface thereof on which the temporary protection pattern formed.

10. A method as claimed in claim 5 further comprising, after the step of forming the first diffusion regions, providing an insulation layer on, and so as to bury therebeneath, the first and second type conductor regions, the insulation layer further having a planarized surface, and etching the planarized surface of the insulation layer until the first type conductor regions are exposed.

11. A method as claimed in claim 10 further comprising forming a conductor pattern on said planarized surface of the insulation layer, in electrical contact with the exposed first type conductor regions.

* * * * *

UNITED STATES PATENT AND TRADEMARK OFFICE
CERTIFICATE OF CORRECTION

PATENT NO. : 5,270,249
DATED : December 14, 1993
INVENTOR(S) : FUKUMA

It is certified that error appears in the above-indentified patent and that said Letters Patent is hereby corrected as shown below:

Col. 10, line 22, change "potion" to --portion--.

Signed and Sealed this

Fourth Day of October, 1994

Attest:

BRUCE LEHMAN

*Attesting Officer*  *Commissioner of Patents and Trademarks*